United States Patent
Gluschenkov et al.

(10) Patent No.: US 6,989,322 B2
(45) Date of Patent: Jan. 24, 2006

(54) METHOD OF FORMING ULTRA-THIN SILICIDATION-STOP EXTENSIONS IN MOSFET DEVICES

(75) Inventors: Oleg G. Gluschenkov, Poughkeepsie, NY (US); Cyril Cabral, Jr., Ossining, NY (US); Omer Dokumaci, Wappingers Falls, NY (US); Christian Lavoie, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 10/707,175

(22) Filed: Nov. 25, 2003

(65) Prior Publication Data

US 2005/0112857 A1    May 26, 2005

(51) Int. Cl.
*H01L 21/3205* (2006.01)
*H01L 21/4763* (2006.01)
(52) U.S. Cl. .............. 438/585; 438/592; 438/595; 438/289; 438/299; 438/301; 438/303
(58) Field of Classification Search ........ 438/299–307, 438/585, 592, 595
See application file for complete search history.

(56) References Cited

U.S. PATENT DOCUMENTS

| | | | |
|---|---|---|---|
| 2003/0136985 A1* | 7/2003 | Murthy et al. | 257/288 |
| 2004/0007724 A1* | 1/2004 | Murthy et al. | 257/288 |
| 2004/0132260 A1* | 7/2004 | Lenoble | 438/306 |
| 2004/0262683 A1* | 12/2004 | Bohr et al. | 257/338 |
| 2005/0087824 A1* | 4/2005 | Cabral et al. | 257/412 |

\* cited by examiner

*Primary Examiner*—Thanh Nguyen
(74) *Attorney, Agent, or Firm*—Howard M. Cohn; H. Daniel Schnurmann

(57) ABSTRACT

Very low resistance, scaled in MOSFET devices are formed by employing thin silicidation-stop extension that act both as a silicidation "stop" barriers and as thin interface layers between source/drain silicide regions and channel region of the MOSFET. By acting as silicidation stops, the silicidation-stop extensions confine silicidation, and are not breached by source/drain silicide. This permits extremely thin, highly-doped silicidation-stop extensions to be formed between the silicide and the channel, providing an essentially ideal, low series resistance interface between the silicide and the channel.

17 Claims, 3 Drawing Sheets

METHOD OF FORMING ULTRA-THIN SILICIDATION-STOP EXTENSIONS IN MOSFET DEVICES

BACKGROUND OF INVENTION

The present invention relates to semiconductor device manufacturing and processing techniques, and more particularly to the formation of lateral extensions in metal oxide semiconductor field effect transistors (MOSFETs).

Over the last several decades, semiconductor device manufacturers have expended considerable effort in reducing the size (scale) of integrated MOSFET (Metal-Oxide-Semiconductor Field-Effect-Transistor) devices while simultaneous increasing their speed and reducing power consumption. With each new generation of scaled (reduced size) MOSFET devices, speed and density are increased, and power consumption is reduced.

In order to support continued scaling (reductions in size) of MOSFET devices, however, series resistance of the devices (including the resistance of lateral extensions of the source and drain), must be reduced at each generation. Without such a reduction in series resistance, scaling of the transistor channel produces diminishing returns in overall device performance, as series resistance (rather than transistor channel resistance) becomes a dominant factor in limiting drive current ($I_{ON}$).

Typically, source and drain regions in a modern MOSFET device are formed of suicides (e.g., Cobalt Silicide $CoSi_2$, Nickel Silicide—NiSi, Titanium Silicide—$TiSi_x$). Silicides are commonly used as conductors and contact materials in silicon semiconductor technology due to their very high conductivity, compatibility with silicon, and suitability to small-geometry semiconductor devices. The high conductivity (low resistivity) of source/drain silicide serves to minimize the contribution of parasitic resistance in the source drain region to the series resistance of MOSFET devices that employ it. The parasitic series resistance of silicide itself is often so small that its contribution to total series resistance is considered to be negligible and not a limiting factor to device performance.

The series resistance of a typical MOSFET device is the sum of source/drain silicide contact resistance (between the silicide and doped silicon), extension resistance, and spreading resistance between the extension and the channel. In order to minimize lateral extension resistance, the extensions are made very short. A typical lateral extension is formed as a shallow doped region having electrical conductivity substantially lower than that of a typical silicide. A typical extension depth in a modern MOSFET device is less than about 50 nm and could be as shallow as 10 nm. Due to the combined effects of relatively low electrical conductivity and relatively shallow depth, a lateral extension may introduce a substantial series resistance, thereby impeding current flow through the transistor. For this reason, the extension is made as short as possible. However, if the extensions are too short, the source/drain silicide may penetrate through the extension and come into direct contact with the channel and the effective contact resistance between the silicide and the channel will become very high due to a relatively low channel carrier concentration and the resultant wide Schottky barrier. Further, the silicide may come into a direct contact with the transistor body creating leakage and increasing circuit power consumption.

Ideally, a thin, highly-doped layer (extension) between the source/drain silicide and the channel would reduce effective contact resistance to acceptable levels by providing a suitable transition interface between the silicide and the channel, thereby substantially eliminating the negative effects of the aforementioned wide Schottky barrier and increased leakage due to the direct contact between the silicide and transistor body.

Conventional processing techniques, however, present a significant obstacle to the formation of a thin, highly-doped layer between the silicide extensions and the channel. By way of example: one approach to forming such a highly-doped layer is to provide very thin nitride spacers around the gate, then to perform silicidation at the extension region. A problem with this technique is that the silicide forms under the spacer due to the generally isotropic nature of the diffusion processes of intermixing silicon and metal atoms. Further, the silicide/silicon interface is usually non-uniform due to "spiking" of the silicide into the silicon beyond the boundary defined by ideal isotropic diffusion processes. Further still, the lateral "roughness" of the silicide can be considerable due to a variety of factors that promote silicide growth under the spacer. Examples of such factors include: preferred growth of the silicide along certain crystal orientations, preferred growth of the suicide in locally stressed areas, and/or preferred growth of the silicide in areas of high silicon crystal defect concentration. These factors present a high probability that the silicide will breach the thin, highly-doped layer and come into direct contact with the channel, effectively increasing the contact resistance of the silicide extensions and the channel and negating the beneficial effect of the thin, highly-doped layer.

If the thickness of the highly-doped layer is increased sufficiently that the probability of the silicide coming into direct contact with the channel is low, then the series resistance of the layer is increased.

In light of the foregoing, it would be desirable to provide a structure and method for reliably forming thin, highly-doped layers between source/drain silicide and a MOSFET channel region without risk of breach by the silicide.

SUMMARY OF INVENTION

The present inventive technique overcomes the problems cited above, providing MOSFET devices with very thin lateral extensions and very low series resistance by employing a thin extension layer of SiGe that acts both as a "silicidation stop" barrier and as a thin interface layer between subsequently formed source/drain silicide and the channel/body of the transistor.

After forming a gate structure on an appropriately prepared substrate (i.e., one in which the channel region has been appropriately defined and in which any required implantations have been performed), a selective etching process is performed to expose sides of the channel region under the gate. The etched-away areas will subsequently become the sites of silicide source/drain regions. A very thin layer (e.g., 10–100 Å) of a highly-doped silicidation-stop material is disposed in the etched away area, coating the exposed sides of the channel region and the substrate in the etched-away areas. The silicidation-stop material is doped appropriately for the type of MOSFET being formed (n-channel or p-channel). The etched away areas are then filled with silicon, e.g., by an Si epi process. And a silicidation process is performed on the silicon fill.

The silicidation-stop material has a silicidation threshold temperature (a temperature above which silicidation will occur) higher than a silicidation threshold temperature for silicon. By performing silicidation on the silicon filled areas at a temperature above the silicidation threshold temperature for silicon, but below the silicidation threshold temperature for the silicidation-stop material, silicidation is confined to the silicon fill and does not extend into or through the silicidation stop material, thereby preventing breach of the silicidation stop material by the silicide.

According to an aspect of the invention, the silicidation-stop material is SiGe, which behaves as a silicidation stop against the formation of $CoSi_2$ (cobalt silicide) below 780° C.

According to another aspect of the invention, the source/drain silicide regions are $CoSi_2$.

According to another aspect of the invention, silicidation is performed at a temperature above the silicidation threshold temperature for the silicide in silicon, but below the silicidation threshold temperature for the silicide in the silicidation stop material. Where the silicidation stop material is SiGe and the silicide is $CoSi_2$, the silicidation step is performed at a temperature above a silicidation threshold temperature $CoSi_2$ formatting in silicon (Si) and below a silicidation threshold temperature for $CoSi_2$ formation in SiGe. For SiGe and $CoSi_2$, those temperatures are 640° C. and 780° C., respectively.

According to another aspect of the invention, the thickness of silicidation-stop extensions is less than 50% of the thickness of the silicide on the adjacent active area.

According to another aspect of the invention, the thickness of the silicidation-stop extensions is greater than a minimum thickness defined by the depletion thickness for an active dopant concentration in the silicidation stop material. Typical active dopant concentrations are greater than $10^{19}$ atoms/$cm^3$. For an active dopant concentration level of $5 \times 10^{19}$ atoms/$cm^3$, the minimum thickness is 15 Å.

It is anticipated by that the semiconductor structure described by the present inventive technique will be part of a larger semiconductor device incorporating a plurality of semiconductor structures in accordance with the present inventive technique. For example, the semiconductor structure could be part of an inchoate p-channel or n-channel MOSFET transistor, or part of a CMOS or mixed-technology device that incorporates both p-channel and n-channel MOSFETs that embody the present inventive technique.

BRIEF DESCRIPTION OF DRAWINGS

These and further features of the present invention will be apparent with reference to the following description and drawing, wherein.

Figure 1:
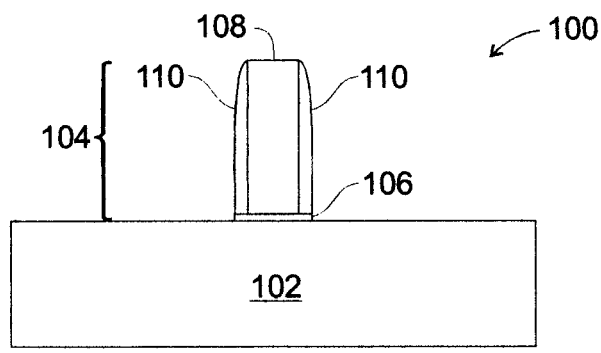
FIG. 1 is a cross-sectional diagram of a starting semiconductor conductor structure for forming ultra-thin silicidation-stop extensions, in accordance with the invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

DETAILED DESCRIPTION

The present inventive technique produces MOSFET devices with low series resistance by replacing "traditionally" constructed source/drain extensions with very thin, highly-doped layers formed in an etched-away region that extends partially under the MOSFET's gate structure. These thin, highly-doped layers act both as silicidation stops and as source/drain lateral extensions. The etched-away regions in the active area adjacent to the thin lateral extension layers are then "filled" with a suitable silicide to complete the source/drain region of the MOSFET. As described in greater detail hereinbelow, the application of the thin lateral extension layers and the silicide in combination yields compact source/drain structures that exhibit very low series resistance.

Under conditions that would ordinarily be expected when forming suicides in doped silicon (using previously known techniques), the process of silicidation can be expected to produce lateral silicide expansion (growth) of approximately 50% of the suicide thickness. This is due to the generally isotropic nature of diffusion processes involved in intermixing silicon and metal atoms. Further, the silicide/silicon interface is usually non-uniform due to "spiking" of the silicide into the silicon beyond the boundary defined by "ideal" isotropic diffusion processes. The lateral "roughness" of the silicide can be considerable due to a variety of factors that promote silicide growth under the spacer. Examples of such factors include: preferred growth of the silicide along certain crystal orientations, preferred growth of the silicide in locally stressed areas, and/or preferred growth of the silicide in areas of high silicon crystal defect concentration. That is, for a silicidation thickness of 300–400 Å (1 Å=1 "angstrom" or "angstrom unit"; 1 angstrom=$10^{-10}$ meters), lateral expansion or growth of the silicidation region during the silicidation process can be expected to be at least 150–200 Å. Accordingly, when forming silicide in doped silicon source/drain extensions of a MOSFET transistor structure, it would ordinarily be necessary to make the doped source/drain extensions sufficiently thick that the anticipated 200 Å lateral expansion of the silicide in such a process will not breach the extensions. Generally speaking, this requires a lateral extension thickness of 300 Å or more. Typically, the lateral extension thickness is about 500 Å in the state-of-the-art transistors with about 40-nm physical gate length. At that thickness, however, the resistance of the extension layer increases significantly. This results in higher effective series resistance, adversely affecting device performance a highly undesirable result.

The ideal situation is to have extremely thin, highly doped silicon extensions (e.g., 10 Å–100 Å on a typical MOSFET structure with at least 300 Å thick source/drain silicide) between the source/drain silicide and the channel. This reduces the effective silicide contact resistance to acceptable levels and minimizes the total series resistance of the lateral extensions. As described hereinabove, however, silicide lateral expansion and "spiking" present serious obstacles to this goal.

The present inventive technique creates this "ideal" combination of extremely thin, highly doped extensions between source/drain silicide and with low extension resistance by employing a thin, highly-doped extension layer that acts as both a thin interface layer between the source/drain silicide and the channel, and as a silicidation stop. Silicon is then disposed over the adjacent active area, (effectively filling it) and silicidation is performed. By virtue of the silicidation stop characteristic of the thin extensions, the silicidation process is tightly controlled, resulting in silicide structures whose extent is well-defined and "self-aligned" to the lateral extensions. This permits extremely thin, "breach-resistant" layers of SiGe to be formed prior to silicidation.

In a preferred embodiment, this silicidation stop material is SiGe and the silicide is $CoSi_2$. The silicidation stop characteristics of SiGe with respect to $CoSi_2$ are described in greater detail hereinbelow. As employed by the present inventive technique, the thin SiGe provides an essentially ideal, well-defined lateral junction in the form of an ultrathin, SiGe layer interposed laterally between the source/drain silicide and the channel. This minimizes the series resistance of the lateral extension and silicide/silicon junction, thereby permitting "scaling" of the MOSFET to very small geometry without degrading transistor performance.

Experimentation has shown that the formation of $CoSi_2$ is slowed when it reaches a SiGe layer. Without any intent for the present inventive technique to be bound by any particular theory of operation, it is believed that this is because the Ge in SiGe is not soluble in the silicide ($CoSi_2$) and must be expelled to the surface before silicide formation will occur in SiGe. This causes the minimum temperature for silicide formation (the silicidation threshold temperature) for SiGe to increase substantially.

As an example, silicidation is performed on two samples using 8 nm Co (cobalt) by annealing at a constant anneal temperature of up to 900° C. for periods ranging from about 10 seconds to several minutes The silicidation process can include several anneal steps each with an independent anneal temperature setpoint. Such silicidation anneals are typically performed in a commercially available rapid thermal annealers (RTAs) capable of sustaining a wide range of anneal temperatures from about 350° C. to about 1150° C. and providing a heating and cooling rates from about 1° C./second to about 100° C./second. The first sample is a silicon substrate and the second sample is 20 nm Si over SiGe. In both samples, the Co reacts with the overlying Si to form a first phase CoSi at about 500° C. In a second phase reaction, the formation of low-resistivity $CoSi_2$ begins forming above 640° C., and proceeds to completion.

Silicide formation in the two different subsrenumbtrates (pure silicon in the first sample and SiGe in the Si over SiGe in the second sample) differs significantly. $CoSi_2$ formation in the pure Si substrate occurs at about 640° C. and proceeds to completion. By way of contrast, silicidation in the SiGe substrate does not complete until about 780° C. During the aforementioned temperature ramp, silicide formation occurs in the overlying 20 nm Si layer at about 640° C., but is effectively stopped at the boundary of the SiGe substrate until about 780° C., after which silicide formation proceeds to completion in the SiGe substrate.

This indicates silicidation threshold temperatures of about 640° C. for Si and about 780° C. for SiGe. By disposing Si over SiGe and annealing with Co at an anneal temperature above 640° C. but less than 780° C., the SiGe acts as a "brick wall" silicidation stop, permitting complete silicidation of the Si, but preventing silicidation past the Si—SiGe boundary.

Those of ordinary skill in the art will understand that any suitable silicide/silicide-stop pair can be employed by the present inventive technique provided that the silicide stop material has a sufficiently low series resistance, does not create a wide Schottky barrier with the silicide of interest, is compatible with silicon and silicon processes, and exhibits an elevated silicidation threshold temperature with respect to the silicidation threshold temperature for silicon. One example of a silicon transistor compatible silicidation-stop layer is a conductive (preferably having free carrier concentration of higher than about $5 \times 10^{19}$ $cm^{-3}$) epitaxial or heteroepitaxial layer with low amount of dangling bonds (preferably lower than about $10^{12}$ bonds/$cm^2$) at the interface with transistor channel material (e.g. silicon). An example of such epitaxial (heteroepitaxial) layer is silicon doped with carbon Si1−x:Cx where the mole fraction of carbon x is less than about 2% (x<0.02). It is believed that such Si:C layer will effectively retard diffusion of metal atoms to become an effective silicidation stop for silicidation processes where metal atoms primarily diffuse into silicon to form a silicide such the case of forming nickel silicide (NiSi). In order to be effective in the context of the present invention, the thickness of the silicidation stop extensions (SiGe) must be greater than the depletion thickness for a given active dopant of higher than $10^{19}$ atoms/$cm^3$. For a typical dopant concentration of $5 \times 10^{19}$ atoms/$cm^3$, the depletion thickness is approximately 15 Å, thereby requiring that the silicidation stop extensions be thicker than 15 Å.

Because the present inventive technique uses a silicidation stop to confine or bound the silicidation process, the present inventive technique permits formation of extremely thin lateral extensions that act as "interface" layers (between source/drain silicide and the MOSFET channel) of less than 50% of the source/drain silicide thickness. This is not achievable using conventional techniques. For example, by employing the present inventive technique whereby SiGe acts as a silicidation stop for $CoSi_x$, SiGe layers of well under 150 Å are readily formed under 300 Å thick CoSi without risk of the silicide breaching the SiGe layer. In fact, extremely thin, "breach resistant" SiGe layers of 10 Å–100 Å thickness can be produced reliably under $CoSi_x$ by the present inventive technique.

The highly doped extension layer can be advantageously made thinner than the charge carrier de Broglie wavelength in a semiconductor (at room temperature the electron de Broglie wavelength in silicon is about 170 Å, for instance). Because of a wave nature of charged carriers (electrons or holes) at such small spatial scale, a portion of the silicide carrier wave function can couple through the extension into the transistor channel. Such wave function coupling can also be interpreted as an injection of silicide carriers into the transistor channel through such thin extensions without interacting with semiconductor lattice and little or no scattering. Because silicide carriers carry a large "Fermi" momentum or, in other words, travel with a characteristic "Fermi" velocity, such momentum injection from the silicide into the channel can lead to a higher charge transfer rate through the transistor or, equivalently, to a higher "on" current. Such momentum injection can only happen at very small distances of less than the de Broglie wavelength of semiconductor carriers. At the same time, the doped lateral extension layer should be made substantially thicker than the depletion width of the silicide-semiconductor Schottky diode as alluded above. Accordingly, a preferred thickness range of doped laterally thin extension is from about 10 Å to about 100 Å.

Attention is now directed to FIGS. 1–5, which illustrate a series of processing steps for forming thin lateral extensions in accordance with the present invention.

FIG. 1 shows a starting structure 100 wherein a gate structure 104 is disposed on a suitably prepared substrate 102 (e.g., SOI). The types of dopants used in preparing the substrates (i.e., their "polarities" n or p and relative concentrations) depends upon the type of transistor being formed. (Those of ordinary skill in the art will immediately understand the types, locations and concentrations of dopants that are appropriate to silicon MOSFET processing.)

The semiconductor substrate 102 may comprise a multi-layer structure in which at least the top layer thereof is semiconducting and, preferably, is silicon. Illustrative examples of multilayer substrate structures include, for example, Si/SiGe, a silicon-on-insulator (SOI) or a strained-silicon-directly-on-insulator (SSDOI). One highly preferred substrate is an SOI substrate. The semiconductor substrate may also comprise of various useful structures such as memory cells, isolation structures (e.g. isolation trenches), dopant wells, locally stressed regions, semiconducting islands with different crystallographic surfaces, three dimensional transistor features such as fins and pillars, and buried contacts and interconnects. While presence of these structures in the substrate 102 is not essential to the practice of the invention, they are typically present in the substrate 102 at this step.

The gate structure comprises a gate electrode 108 (typically polysilicon) over a thin gate insulator 106 (e.g., nitride or oxide) and spacers 110.

The gate insulator 106 is formed on the surface of a semiconductor material (e.g. silicon) by deposition or thermal oxidation, nitridation or oxynitridation. Combinations of the aforementioned processes may also be used in forming the gate dielectric. The gate dielectric is comprised of an insulating material including an oxide, nitride, oxynitride or any combination thereof. A highly preferred insulating material that is employed in the present invention as the gate dielectric is nitrided $SiO_2$ or oxynitride. Although it is preferred to use nitrided $SiO_2$ or oxynitride as the gate dielectric material, the present invention also contemplates using insulating materials, i.e., dielectrics, which have a higher dielectric constant, k, than nitrided $SiO_2$. For example, the gate dielectric may comprise a oxynitride-nitride stack, a pure nitride, a high-k oxide or oxynitride or respective silicate such as $Al_2O_3$ $HfO_2$, $HfO_xN_y$, $HfSi_xO_yN_z$. The physical thickness of the gate dielectric may vary, but typically the gate dielectric has a thickness of from about 0.5 to about 20 nm, with a thickness of from about 1.0 to about 3.0 nm being more highly preferred.

The gate electrode 108 or gate is composed of a conductive material such as doped silicon and its alloys such as silicon-germanium (SiGex) or silicon-carbon (SiCx) and/or other conductive materials including elemental metals (W, Ta, Mo, Ti, Re, Ir, Al, etc.), metal suicides (CoSix, NiSix, WSix, TiSix), metal nitrides (WN, TaN, TiN) and its alloys. The gate electrode material can be in either crystalline, polycrystalline, or amorphous form. The gate electrode may include multiple layers of various conducting materials. One highly preferred gate electrode material is doped polysilicon.

The gate electrode material is patterned to form narrow transistor gates 108. The patterning step is typically accomplished using known photolithography techniques. A reactive ion etch (RIE) is typically employed to complete photolithography pattern transfer into the gate. The last portion of gate RIE step is selected to be highly selective to a particular choice of gate insulator to stop on it. After gate etch, a thin spacer 110 (preferably, silicon nitride and/or oxide) is provided on either side of each gate. The spacer is formed by first forming a conformal layer of a material by thermal oxidation, nitridation or known deposition methods with subsequent directional RIE etch. A preferred spacer thickness range is from about 30 Å to about 250 Å.

At this point, HALO implants and annealing may also have been performed. The halo implants can be performed either before or after formation of the spacer 110. Preferably and depending upon device type, a $10^{13}$–$10^{14}$ atoms/cm$^2$ dose of arsenic (As), boron (B), boron difluoride (BF2) or phosphorous (P) is implanted at a tilt angle of about 100 to about 30° C. with a halo implant energy of from about 1 KeV to about 100 KeV. After the halo implant, preferably, the halo dopant is activated with a 100 microsecond to 10 second (100 µs to 10 s) anneal at from 900° C. to 1410° C.

Typically, the starting structure 100 is an inchoate (in-process, not yet fully formed) MOSFET.

Figure 2:
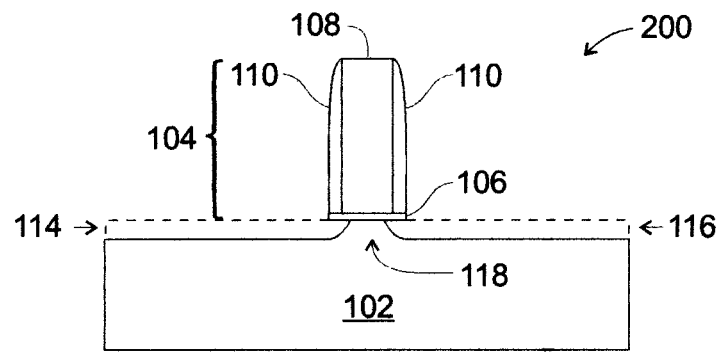
FIG. 2 is a cross-sectional diagram of the semiconductor structure of FIG. 1 after performing an etching process, in accordance with the invention.

A sequence of etches with optional assist steps is then done on the silicon substrate 102, yielding the structure shown in FIG. 2.

FIG. 2 shows a structure 200 wherein etched-away regions 114 and 116 have been formed. These etched-away regions 114, 116 extend laterally partway under the gate structure 104 to expose sides of a channel region 118 under the gate. In the Figure, this exposed channel region 118 appears as a sort of pedestal supporting the gate structure 104.

The sequence of etches employed to obtain the structure shown in FIG. 2 comprises a combination of suitable isotropic and anisotropic etches which are selective to the spacers 110.

The first etch is a directional (anisotropic) etch which removes exposed gate insulator 106 and recesses the surface of the substrate 102 to below the gate insulator-substrate interface. One example of such directional etch is a slow RIE of silicon which is not highly selective to silicon oxynitride. Alternatively, the exposed gate insulator 106 can be removed prior to the silicon RIE in a solution of hydrofluoric (HF) acid. In all these examples, the depth of the surface recess is controlled by the speed of etching rate and etching process time.

Alternatively, the surface of a semiconductor substrate 102, which is comprised of a single crystal semiconductor (e.g., silicon), is first converted to a thin amorphous layer prior to the surface recess step. In one example, silicon surface is amorphized by implanting a $10^{14}$–$10^{16}$ atoms/cm$^2$ dose of large ions (with an ion nucleus equal to or larger than that of Si+, e.g. As+, Xe+, Ar+, Ge+, and Si+) into the surface at the implant energy of from about 1 KeV to about 50 KeV. Then, the exposed gate insulator is first stripped by either an RIE step or a HF dip step. Then, the underlying amorphous silicon is etched away, using an etchant that is selective to the underlying crystalline silicon substrate 102 and the gate insulator 106. Addition of such preamorphization step followed by a selective etch of amorphized layer allows for a precise control of the recess. In this case, the recess depth is primarily controlled by implantation step.

Once recessed, the semiconductor substrate surface can be undercut with a semiconductor etch to provide a small overlap between the gate electrode 108 and the etched-away regions 114 and 116 (preferably, 10 Å–30 Å of overlap). Such explicit undercutting process can employ a very slow isotropic semiconductor etch to laterally undercut the semiconductor. In one example, the silicon substrate is undercut by a wet etch of silicon in a solution of $NH_3OH$.

Alternatively, a semiconductor etching process that etches along different semiconductor crystallographic planes at different rates can be used to expose a certain crystallographic plane (e.g. (111) plane of silicon crystal) which has an angle of less than 90° C. between such slow etching plane and the substrate surface. The applicants note that an additional advantage of such crystal-plane-dependent undercut is that the (111) silicon plane is more stable against formation of surface silicon oxide than other crystallographic planes. Presence of native oxide on silicon surfaces is highly undesirable because it can interfere with epitaxial processes. It should also be noted that such crystal-plane-dependent undercutting allows for a more controlled amount of overlap between the gate structure 104 and the etched-away regions 114 and 116. Clearly, due to a fixed undercut angle, the overlap variation is only related to the variation of recess depth.

Figure 3:
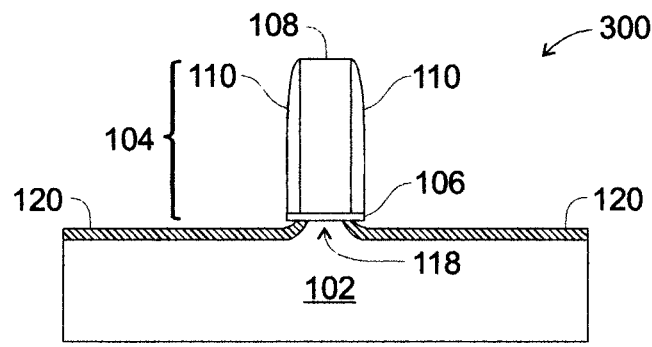
FIG. 3 is a cross-sectional diagram of the semiconductor structure of FIG. 2 after deposition of a thin, highly-doped layer, in accordance with the invention.

Next, thin layers of doped silicidation-stop material (e.g., SiGe) are disposed in the etched away regions 114 and 116 to produce the structure shown in FIG. 3.

FIG. 3 shows a structure 300 resulting from disposing highly-doped silicidation-stop material into the etched-away regions 114 and 116 of FIG. 2 to form thin silicidation-stop extensions 120 on either side of the channel region 118. The "polarity" of the dopant (n+ or p+) depends upon the type of MOSFET (n-channel or p-channel) being formed. The thin silicidation-stop extensions 120 cover the surface of the etched away regions 114, 116, including the (formerly) exposed sides of the channel region 118, partially filling the etched-away regions 114, 116 (FIG. 2). The thickness of the silicidation-stop extensions is greater than or equal to the depletion thickness for the active dopants in the silicidation-stop material.

In one example, the SiGe silicidation-stop layer is formed using a well-known epitaxial growth process. Prior to performing such epitaxial process, the surface of recessed silicon is cleaned to remove any material present on exposed surfaces (e.g. native oxide). The cleaning step may include a HF-based wet clean step, a silicon surface passivation with easily removable absorbent step, and/or an in-situ bake in a reducing atmosphere (e.g. $H_2$) at reduced pressure.

The epitaxial growth of SiGe is performed in the ambient comprised of silicon and germanium precursors (e.g. silane $SiH_4$ and germane $GeH_4$, respectively). The process temperature can vary from about 400° C. to about 900° C. In one example, the SiGe silicidation-stop layer is grown undoped and then doped in accordance with the device type with the aid of a hard mask. The undoped silicidation-stop layer can be doped by any known method such as gas phase doping, solid source doping, or angled implantation. In another example, the silicidation-stop layer can be doped in-situ by adding suitable gas precursor to the growth ambient. Typical gas precursors for in-situ doping include a diborane ($B_2H_6$) gas for p-type boron dopant or phosphine ($PH_3$) or arsine ($AsH_3$) gas for n-type phosphorus dopant. In the case of in-situ doped silicidation-stop layer, the epitaxial process can be repeated for NFET and PFET layers with the aid of a hard mask. In the case of several consecutive epitaxial growth steps, the epitaxy is performed selective to the spacer/hard mask material such that no silicon-germanium is formed on the hard mask. Selective silicon-germanium epitaxy is well known in the art. In the case selective epitaxy, the gaseous precursor for silicon is either a silicon tetracloride or a mixture of dichlorosilane and hydrochloric acid.

Figure 4:
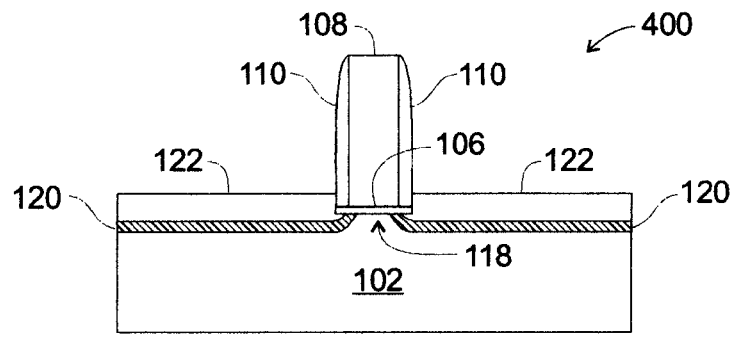
FIG. 4 is a cross-sectional diagram of the semiconductor structure of FIG. 3 after a silicon fill process, in accordance with the invention.

Next, etched-away areas 114, 116 are filled with Si over the thin silicidation-stop extensions 120, e.g., by a selective Si epi process, to form the structure shown in FIG. 4.

FIG. 4 shows a structure 400 resulting from filling etched away areas 114 and 116 over the silicidation-stop extensions 120. Silicon fill regions 122 now completely fill the etched away areas 114 and 116 (see FIG. 2) over the thin silicidation-stop extensions 120, thereby interposing the thin silicidation-stop extensions 120 between the Si fill regions 122 and the channel region 118 (and the substrate 102).

Next, a junction activation anneal is conducted to electrically activate dopants in the extensions. Junction activation anneal is a short high-temperature anneal with a typical duration of from about 100 $\mu$s to about 2 seconds and a typical temperature of from about 900° C. to about 1400° C. Junction activation anneals are conducted in one of the commercially available fast-anneal tools such as RTA, laser anneal systems, or flash anneal systems. Ultra short anneals with characteristic time of from several hundreds microsecond to a few milliseconds are highly preferred because of the absence of excessive dopant diffusion.

Next, silicidation of the silicon fill regions 122 is performed by a suitable process, such as RTA (rapid thermal annealing) of metal directly deposited onto the silicon fill at a temperature above the silicidation threshold temperature of Si, but below the silicidation threshold temperature of silicidation stop material. In the case where $CoSi_2$ and SiGe are the silicide and silicidation-stop materials, respectively, silicidation is performed at a temperature above 640° C. but less than 780° C. (the silicidation threshold temperatures for the formation of $CoSi_2$ in Si and SiGe, respectively). As described hereinabove, silicidation under these conditions constrains downward and lateral expansion of the resultant silicide to the boundaries between the silicon fill regions 122 and the silicidation-stop SiGe extension layers 120. Any unreacted metal is removed by a selective metal etch in a solution of strong acid (e.g. solution of sulfuric acid $H_2SO_4$). This results in the structure shown in FIG. 5.

Figure 5:
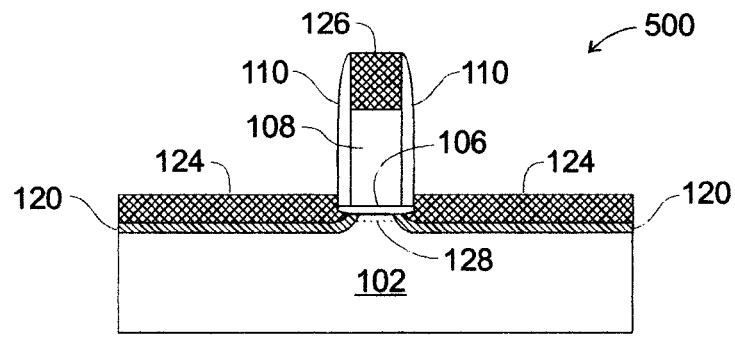
FIG. 5 is a cross-sectional diagram of the semiconductor structure of FIG. 4 after a silicidation process, in accordance with the invention.

FIG. 5 shows a structure 500 resulting from silicidation of the silicon fill regions 122 of FIG. 4. In FIG. 5, the silicidation of the silicon fill regions 122 has proceeded to completion but has been stopped by the thin silicidation-stop extensions 120, thereby forming well-defined source/drain silicide regions 124 separated from the channel region 118 (and substrate 102) by the thin silicidation-stop extensions 120. Due to the precise control and bounding of the silicidation process by the thin silicidation-stop extensions, the lateral junctions formed by the channel region 118, the thin silicide-stop extensions 114, 116 and the source/drain silicide regions 124 are both compact and very well defined. A by-product of the silicidation process is that a top portion of the gate electrode 108 is converted to silicide, thereby forming a gate conductor 126 overlying and in electrical contact with the gate electrode 108.

When the source/drain silicide regions and the gate (conductor/electrode) are properly biased, a shallow channel 128 is formed under the gate insulator 106 between the silicide-stop extensions 120 across which electrical current passes. The highly-doped silicide-stop extensions 120 provide an interface between the source/drain silicide regions 124 and the channel 128 whereby a wide Schottky barrier is not formed between the silicide and the channel region 118 and extensions 120 are substantially laterally thin, thereby minimizing effective series resistance.

By the inventive technique described hereinabove with respect to FIGS. 1–5, the silicidation-stop extensions can made be extremely thin, e.g., (10–100 Å SiGe under 300 Å thick CoSi$_2$ source/drain silicide) while remaining resistant to breach (in the manner described hereinabove) by the silicidation process.

One potential issue that arises is silicidation damage to the gate oxide/insulator. If the gate oxide/insulator (106) is sufficiently damaged/eroded by the silicidation process, the source/drain silicide (124) could come into direct contact with the gate electrode 108, effectively shorting the source/drain silicide to the gate, thereby rendering the transistor inoperable. Those of ordinary skill in the art will understand that there are a number of approaches to dealing with this issue. Two representative possibilities are: thickening the gate oxide/insulator at the edges in the vicinity of the silicide lateral extensions (bird's beak structure); and controlling the amount of "undercut" of the gate structure and the thickness of the thin silicidation stop extensions such that silicidation does not interact with the gate oxide/insulator. These two techniques are described hereinbelow with respect to FIGS. 6 and 7.

Figure 6:
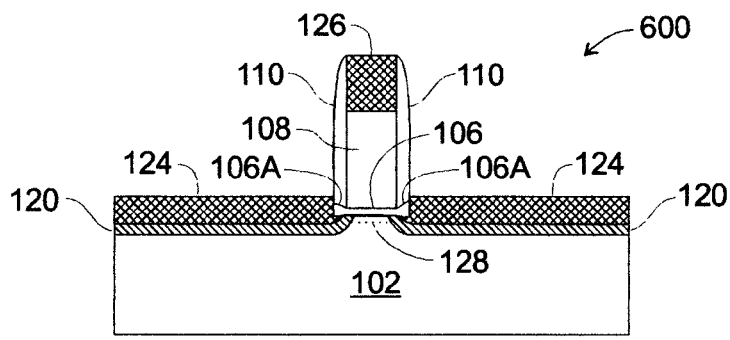
FIG. 6 is a cross-sectional diagram of a semiconductor structure in accordance with the invention, illustrating a first technique for preventing gate oxide damage.

FIG. 6 shows a structure 600, similar to the structure 500 of FIG. 5, but wherein thickened portions 106A of the gate insulator 104 have been formed to prevent damage to the gate insulator 106 by the silicidation process from allowing the source/drain silicide 124 to come into contact with the gate contact 106. In accordance with the known techniques, the "bird's beak" at the edges of gate insulator 106 can be formed directly prior or during formation of the spacers 110.

Figure 7:
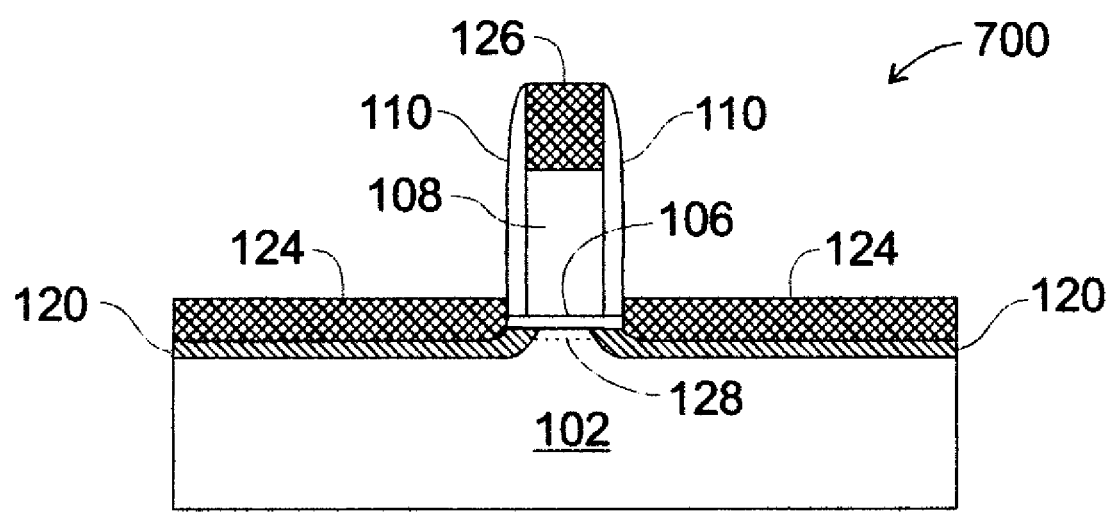
FIG. 7 is a cross-sectional diagram of a semiconductor structure in accordance with the invention, illustrating a second technique for limiting gate oxide damage.

FIG. 7 shows a structure 700, similar to the structure 500 of FIG. 5, but wherein the selective etch process (see discussion above with respect to FIGS. 1, 2) and the thickness of the silicidation stop layers 120 (see discussion above with respect to FIGS. 2, 3) have been controlled such that the source/drain silicide regions 124 do not extend under the gate insulator 106.

Those of ordinary skill in the art will understand that in a CMOS process employing complementary p-channel and n-channel MOSFET transistors, the present inventive technique is readily applied to both the p-channel and the n-channel MOSFETS. The SiGe layers must be doped appropriately for the type of transistor to which they are being applied Typically, a hard mask would be required to selectively form NFET and PFET extensions.

Because of a high processing temperature, a typical photoresist (PR) based block masks cannot be employed to form a differently doped silicidation-stop layers in NFETs and PFETs. A hard mask that can withstand high processing temperature is needed to form differently doped silicidation-stop layers. As an example, a thin silicon nitride layer similar to that of the spacer material can be first disposed over entire substrate prior to the substrate surface recess steps. Then, a PR based mask is employed to expose desired areas and block other regions. A directional RIE step can then be performed to form a thin gate spacer 110 in the first open area while leaving PR (photoresist) in other areas. After stripping away the PR, the selected devices (PFETs or NFETs) have a thin gate spacer 110 with an exposed horizontal substrate surface while other devices (non-selected devices, ie., NFETs or PFETs, accordingly) are covered with a nitride liner, a hard mask. Doped silicidation-stop extensions with silicon fill atop can then be formed only in the first area by a selective epi processes in accordance with the process steps alluded above. A second thin nitride film can then be disposed over entire substrate and patterned using a second PR mask to form a thin spacer 110 in a second area while protecting other areas. Upon completing silicidation-stop extensions and silicon fill in the second area, a blanket RIE spacer etch can be performed to expose silicon fill in the first area.

Those of ordinary skill in the art will understand that there are many other hard mask materials and techniques that can be used to block one area while allowing selective epitaxial growth and/or doping in another area. Ideally, a hard mask material is chosen such that it can be selectively etched with respect to the outer spacer material (e.g. nitride), gate dielectric (e.g. nitride oxide), and the substrate (e.g. silicon). One example of such hard mask material is carbon. Carbon hard mask can be easily removed by ashing processes selective to silicon nitride, oxynitride, and silicon.

If the SiGe epi layer is not in-situ doped, it can be selectively doped. One particularly useful example of such selective doping is a solid source doping. A doped film (a solid source of dopants) such as doped oxide film (e.g. a Borosilicate glass BSG, Arsenosilicate glass ASG, or Phosphorsilicate PSG) can be deposited everywhere after the SiGe epi. The doped film is then patterned and selectively removed such that it remains only in a first area. The structure can then be annealed in a RTA (rapid thermal annealing) system or other short-anneal system. The thermal budget of the annealing process should be such that the lateral junction depth will be less than 15–100 Å. After the drive-in anneal, the doped film is selectively removed resulting in selective doping in the first area. The procedure can then be repeated to selectively dope a second region. BSG films can be employed to selectively dope PFET extensions with Boron (a p-type dopant) while either ASG or PSG films can be used to selectively dope NFET extensions with either arsenic or phosphorus, respectively.

Due to the slow diffusion of Arsenic at a given thermal budget, ASG is a preferred solid dopant source for NFET extensions and is typically conducted prior to PFET extension doping.

Those of ordinary skill in the art will immediately understand that certain processes such as halo implantation and/or junction activation anneals can be performed at various places in the inventive process. For instance, if the thermal budget of epi processes or doping processes is high with respect to the diffusion of NFET halo dopant (typically boron), halo implantation can be performed after forming extensions.

Those of ordinary skill in the art will immediately understand that in order to reduce junction capacitance and current crowding effects, an additional implant step can be performed to thicken the doped region underneath the silicide. Such optional implantation step can be followed by an optional anneal step which heals implant damage.

Other factors that will be understood by those of ordinary skill in the art include the selection of low-thermal-budget processes during typical processing after silicide formation to avoid substantial diffusion and deactivation of dopants.

Those of ordinary skill in the art will immediately understand and appreciate that semiconductor processing techniques such as the present inventive technique are intended to be performed on automated equipment under the control of a computer. The computer is guided by a set of instructions, said instructions usually provided to the computer on a computer readable medium such as a disk or tape, or via an electronic transfer medium such as a computer network or the Internet. It is fully within the spirit and scope of the present invention to embody instructions for controlling a computer to form the semiconductor structure(s) and device(s) described hereinabove in computer readable form on such computer readable media.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor device, comprising:
    providing a semiconductor structure comprising a silicon substrate and a gate structure formed on the silicon substrate, said gate structure further comprising a gate contact and a gate insulator;
    selectively forming etched-away regions in the substrate to expose sides of a channel region under the gate structure;
    disposing a thin, highly-doped layer of a silicidation stop material within the etched-away regions, the silicidation stop material partially filling the etched-away regions and forming silicidation-stop extensions;
    disposing a silicon fill layer within the etched-away regions over the silicidation stop material; and
    performing silicidation to form silicide in the silicon fill layer, thereby forming source/drain silicide regions;
    wherein the silicon fill layer fills the etched away regions over the thin silicidation-stop extensions, thereby interposing the thin silicidation-stop extensions between the silicon fill layer and the channel region and between the silicon fill layer and the substrate; and
    wherein the silicidation-stop extensions are thin as compared with the silicon fill.

2. A method according to claim 1, wherein the silicidation step is performed at a temperature above a silicidation threshold temperature for the silicide in silicon, but below a silicidation threshold temperature for silicide in the silicidation stop material.

3. A method according to claim 2, wherein the silicidation stop material comprises SiGe.

4. A method according to claim 3, wherein the silicide comprises $CoSi_2$ (cobalt sulicide).

5. A method according to claim 4, wherein the silicidation step is performed at a temperature above a silicidation threshold temperature $CoSi_2$ formatting in silicon (Si) and below a silicidation threshold temperature for $CoSi_2$ formation in SiGe.

6. A method according to claim 4, wherein the silicidation step is performed at a temperature above 640° C. and below 780° C.

7. A method according to claim 1, wherein the silicidation stop material is in-situ doped.

8. A method according to claim 1, wherein the thickness of silicidation-stop extensions is less than 50% of the thickness of the silicide lateral extensions.

9. A method according to claim 8, wherein the thickness of the silicidation-stop extensions is greater than a minimum thickness defined by the depletion thickness for an active dopant concentration in the silicidation stop material.

10. A method according to claim 9, wherein the active dopant concentration is greater than $10^{19}$ atoms/cm$^3$.

11. A method according to claim 9, wherein the minimum thickness is 10 Å.

12. A method according to claim 1, wherein the semiconductor structure comprises an inchoate n-channel MOSFET.

13. A method according to claim 1, wherein the semiconductor structure comprises an inchoate p-channel MOSFET.

14. A method according to claim 1, wherein the semiconductor structure comprises part of an inchoate CMOS device.

15. A method according to claim 1, wherein the highly-doped layer of the silicidation stop material is formed using an epitaxial growth process.

16. A method according to claim 1, wherein the silicon fill is disposed by a selective Si epi process.

17. A method according to claim 1, wherein the silicidation-stop extensions have a thickness of 10–100 Å, and the silicon fill layer has a thickness of approximately 300 Å.

* * * * *